United States Patent [19]

DeBar et al.

[11] 4,102,714
[45] Jul. 25, 1978

[54] PROCESS FOR FABRICATING A LOW BREAKDOWN VOLTAGE DEVICE FOR POLYSILICON GATE TECHNOLOGY

[75] Inventors: David E. DeBar, Manassas; Francisco H. De La Moneda, Reston, both of Va.

[73] Assignee: International Business Machines Corporation, Armonk, N.Y.

[21] Appl. No.: 679,544

[22] Filed: Apr. 23, 1976

[51] Int. Cl.² .................. H01L 21/22; H01L 21/302; H01L 29/78
[52] U.S. Cl. ........................... 148/187; 29/571; 29/577 R; 29/578; 29/580; 148/174; 148/175; 156/647; 156/653; 156/657; 156/662; 357/13; 357/20; 357/23; 357/41; 357/55; 357/59; 357/60
[58] Field of Search ................ 148/174, 175, 187; 29/571, 577, 578, 580; 156/17, 647, 653, 657, 662; 357/13, 20, 23, 41, 55, 59, 60

[56] References Cited

U.S. PATENT DOCUMENTS

| | | | |
|---|---|---|---|
| 3,171,762 | 3/1965 | Rutz | 148/175 |
| 3,423,606 | 1/1969 | Wanlass | 357/13 |
| 3,458,781 | 7/1969 | Simon | 357/20 |
| 3,514,845 | 6/1970 | Legat et al. | 29/571 |
| 3,694,705 | 9/1972 | Wenzig | 357/20 X |
| 3,699,646 | 10/1972 | Vadasz | 29/571 |
| 3,754,171 | 8/1973 | Anzai | 357/41 |
| 3,783,044 | 1/1974 | Cheskis et al. | 148/175 |
| 3,793,712 | 2/1974 | Bean et al. | 29/577 |
| 3,847,687 | 11/1974 | Davidsohn | 148/187 |
| 3,904,450 | 9/1975 | Evans et al. | 148/175 |
| 3,953,866 | 4/1976 | Russell | 357/44 |
| 3,975,752 | 8/1976 | Nicolay | 357/55 X |

FOREIGN PATENT DOCUMENTS

923,513  4/1963  United Kingdom ............... 357/13

OTHER PUBLICATIONS

Walker; B. J., "Low-Voltage Protective Diode" I.B.M. Tech. Discl. Bull., vol 11, No. 11, Apr. 1969, p. 1479.
Declercq; M. J., "New C-MOS . . . , Anisotropic Etching of Silicon" IEEE J. Solid-State Circuits, vol. SC-10, No. 4, Aug. 1975, pp. 191-197.
Wu; L. L., "Doped P Ø N Pockets for Complementary FETs" I.B.M. Tech. Discl. Bull., vol. 15, No. 7, Dec. 1972, p. 2279.

*Primary Examiner*—R. Dean
*Assistant Examiner*—W. G. Saba
*Attorney, Agent, or Firm*—John E. Hoel

[57] ABSTRACT

A structure and process are disclosed for making a low-voltage breakdown p-n junction in a semiconductor substrate. The process comprises the step of etching a V-shaped groove in a semiconductor substrate of a first conductivity type, with an anistropic etchant, followed by depositing a layer of epitaxial semiconductor material of a second conductivity type in the V-shaped groove. There results a p-n junction with a small radius of curvature at the apex of the V-shaped groove having a correspondingly low breakdown voltage.

5 Claims, 8 Drawing Figures

PROCESS FOR FABRICATING A LOW BREAKDOWN VOLTAGE DEVICE FOR POLYSILICON GATE TECHNOLOGY

FIELD OF THE INVENTION

The invention disclosed relates to semiconductor processes and structures and more particularly relates to low breakdownvoltage devices.

BACKGROUND OF THE INVENTION

MOS chips mounted on modules are often destroyed by electrostatic discharges (ESD). ESD takes place when two or more of the module pins come into contact with two bodies charged to different potentials. When contact is established, a redistribution of charges takes place which subjects the thin oxide regions connected to input-output (I/O) pins to electric fields capable of rupturing the oxide if they are larger than $10^7$ V/cm for a duration of time longer than the retention time of the MOS system. One solution to this hazard is to shunt ESD through protective devices (PD's) which are placed between the I/O pads and the semiconductor substrate of the chip. Most PD structures consist of one or more p-n junctions interconnected or designed to turn on at a voltage well above the maximum level of the logical signals but below the low tail of the statistical distribution of the thin oxide breakdown voltages. For instance, for a nominal 5 V power supply and 500Å gate oxide layer thickness, the PD turn-on voltage has to be larger than 8 V and below 35 V; the upper bound being two standard deviations below the average oxide breakdown voltage for 500Å of $SiO_2$. The conventional ways of tailoring the junction breakdown voltage to meet this type of specification are reviewed as follows. It is well known that for diffused junctions 6 in FIG. 1, the avalanche breakdown voltage takes place preferentially at those sections of the junction 6 with the smallest radius of curvature. The radius of curvature can be controlled by electrical bias or fabrication techniques. A common structure belonging to the first category consists of a junction 6 gated with a metal plate 10 connected to substrate 2. The plate 10 inverts the portion of the diffusion 6 underneath it to the polarity of the substrate 2. The electrical junction 6' then has a small radius of curvature near the surface with a correspondingly low breakdown voltage. This is illustrated in FIG. 1.

A junction with this sharp edge can also be fabricated using a shallow ion implant of the same polarity as the substrate. This permanent alteration of the junction is discussed in the copending United States patent application Ser. No. 516,929, filed Oct. 22, 1974, by C. L. Bertin, et al., and assigned to the instant assignee. Another fabrication technique to decrease the radius of curvature of a diffused junction is to control the junction depth by the duration of the thermal drive-in cycle, the shallower the junction, the smaller the radius of curvature and the lower the breakdown voltage. All of the aforementioned approaches to adjusting the radius of curvature of junctions used for PD structures have limitations of their own. The breakdown voltage of gated junctions 6 depends on the thickness of the overlapping thin oxide 8 which is determined by MOS circuit considerations. Hence, a gated junction may have a breakdown voltage outside the range specified. For implanted juntions, ion-implantation equipment is needed. Control of the depth of very shallow junctions is difficult unless ion-implantation is used.

OBJECTS OF THE INVENTION

It is therefore an object of the invention to form a low breakdown voltage device in an improved manner.

It is still another object of the invention to form a low breakdown voltage junction having a radius of curvature independent of the thickness of overlying insulating layers.

It is another object of the invention to form a low breakdown voltage device having a precise breakdown value.

SUMMARY OF THE INVENTION

These and other objects, features and advantages of the invention are accomplished by the structure and process disclosed herein.

The process for making a low voltage breakdown p-n junction in a semiconductor substrate comprises the steps of etching a V-shaped groove in a semiconductor substrate of a first conductivity type, with an anisotropic etchant and then depositing a layer of epitaxial semiconductor material of a second conductivity type in the V-shaped groove. There results an abrupt p-n junction with a small radius of curvature formed at the apex of the V-shaped groove, having a low breakdown voltage. The process is especially useful to fabricate devices to protect MOS chips against electrostatic discharge. The process steps can most conveniently be employed in polycrystalline silicon gate technology, however, the process steps can be employed in any semiconductor fabrication technology where an epitaxial deposition step can be economically included.

The low voltage breakdown p-n junction structure comprises a semiconductor substrate of a first conductivity type having a V-shaped groove therein and a layer of epitaxial semiconductor material of a second conductivity type deposited in the V-shaped groove. An abrupt p-n junction is formed at the apex of the V-shaped groove having a low breakdown voltage.

DISCUSSION OF THE FIGURES

These and other objects, features and advantages of the invention can be more readily appreciated upon reviewing the accompanying figures.

DISCUSSION OF THE PREFERRED EMBODIMENT

A process is disclosed for forming a low voltage breakdown p-n junction structure which is especially useful as a protective device aginst electrostatic discharge (ESD) on a MOS chip. The process steps can most conveniently be employed in polycrystalline silicon gate technology, however, the process steps can be employed in any semiconductor fabrication technology where an epitaxial deposition step can be economically included.

To meet the need by MOS-LSI chips for low sheet resistance diffused lines, relatively deep junctions are required. Contrariwise, the protect these chips from electrostatic discharges, shallow junctions with low breakdown voltages are needed. The method disclosed makes low breakdown junctions for protective devices independent of the specifications of the diffused lines.

An additional masking step is introduced into the conventional four-mask polysilicon process to produce p-n junctions which can have near spherical shapes as opposed to conventional diffused junctions whose geometry is closer to a cylindrical shape. Because of the near spherical geometry it is possible to get lower breakdown voltages than those of diffused junctions, without having to resort to extremely shallow junction depths which are difficult to control. See, for example, S. M. Sze and G. Gibbons, "Effect of Junction Curvature on Breakdown Voltages in Semiconductors," *Solid State Electronics*, Vol. 9, 1966, page 831.

Figure 1:
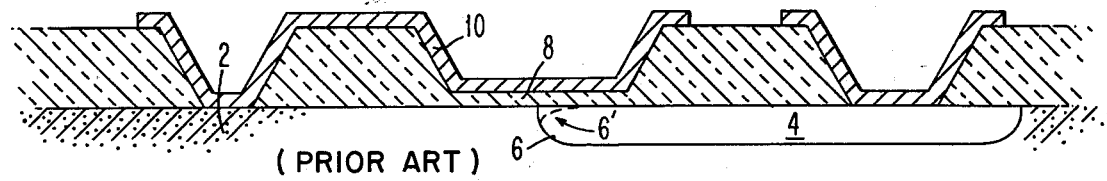
FIG. 1 illustrates a prior art electrostatic discharge protective device employing a gate to reduce the electrical junction curvature of the diffused junction at the surface.
Figure 2:
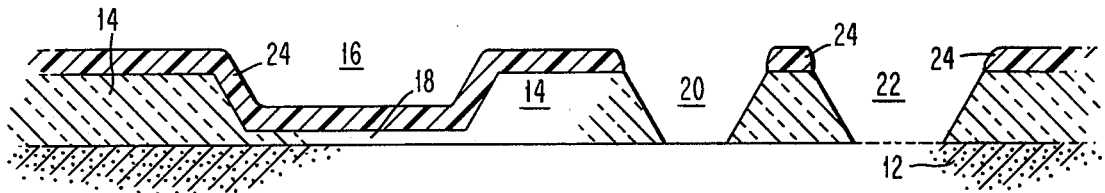
FIG. 2 illustrates a cross-sectional view of the protective device invention after the second masking step.

The fabrication steps for the protective device structure with low breakdown voltage are as follows:

(1) Start with a (100) oriented p or n type silicon substrate 12 shown in FIG. 2. Grow a thermal field oxide 14 to a thickness of about 5000A.

Mask #1

(2) Use mask #1 to define a region 16 in FIG. 2, where a polysilicon gate and adjacent source and drain regions are to be located.

(3) Grow a thermal oxide layer 18 in the opening 16 made during step #2 to a thickness of about 500A. Deposit a photoresist layer 24 over the structure in preparation for the next masking step, as shown in FIG. 2.

Mask #2

(4) Use mask #2 to define openings 20 and 22 for the location of the protective device junctions. These locations are adjacent to the I/O pads around the periphery of the chip. This is a non-critical mask alignment step.

Figure 3:
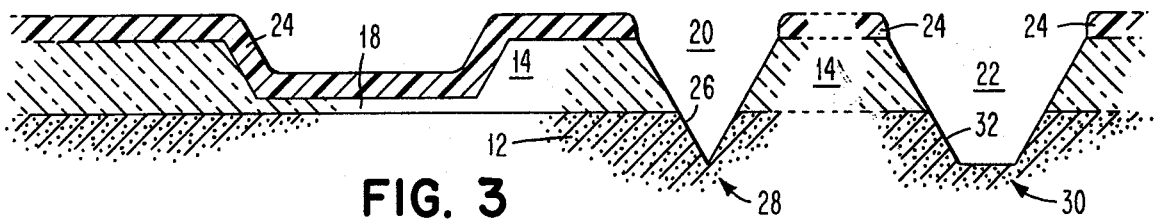
FIG. 3 illustrates a cross-sectional view of the protective device invention after forming the grooves 28 and 30 with an anisotropic etch.

(5) Use an anisotropic etchant such as a solution of hydrazine and water, ethylene-diamine or potassium hydroxide to etch the (100) plane exposed by openings 20 and 22 made using mask #2. For more details see M. Declercq, "A New C-MOS Technology Using Anisotropic Etching of Silicon", *IEEE J. of Solid-State Circuits*, Vol. SC-10, August 1975, pages 191–197. Anisotropic etchants attack the other crystallographic planes at a very slow rate or not at all. Thus, in FIG. 3, the etching action stops when all of the (100) plane has been consumed and a V-shaped depression 26 is formed. The V-angle is 70°. The depth, $X_j$, of a groove for a given mask width, W, is then $X_j=0.7W$. If the etching is stopped before it runs its course, the bottom 30 of the depression 22 will be flat intercepting the tapered sidewalls 32 at an angle of 125°. P-N junctions with these sharp contours will have low breakdown voltages, with the lowest corresponding to the V-groove shape 28. The fabrication of these p-n junctions is explained in steps 6, 7 and 8, which follow the removal of the photoresist layer 24.

Figure 4:
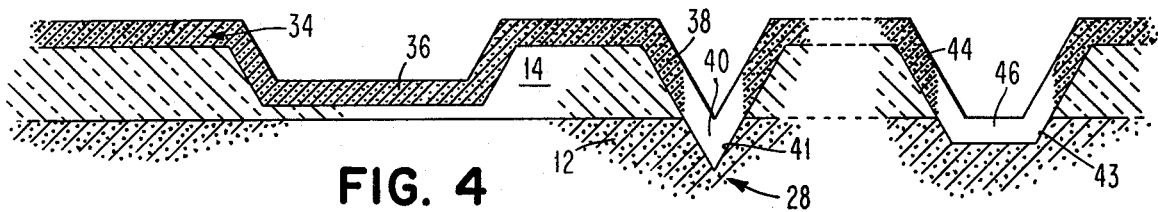
FIG. 4 illustrates a cross-sectional view of the protective device invention after the deposition of the silicon layer 34.

(6) In FIG. 4, an epitaxial deposition using silane and arsine yields a 5000Å thick n-doped silicon layer 34. This layer has polycrystalline regions 36, 38 and 44 when deposited on oxide regions 14 and 18 and monocrystalline regions 40 and 46 over the exposed p-type substrate regions 28 and 30. These latter regions form p-n junctions 41 and 43. Good quality junctions are reported in the above reference by Declercq. The doping introduced during the epi-growth should be high enough so that an abrupt doping profile results and also to enable the use of polysilicon gate 36 as an interconnection level. This dopant must be kept from diffusing into the substrate if the lowest breakdown voltage is desired. Hence, it should diffuse slowly relative to the dopant used for the source and drain in step 9. For instance, arsenic is a suitable slow diffusing n-type dopant.

Mask #3

(7) A 1000Å nitride layer is deposited over the entire wafer by chemical vapor deposition (CVD). Mask #3 is then used to define photoresist patterns on this layer for the PD's, device gates and associated interconnections. Reactive plasma etching of the nitride regions left unprotected after developing and baking of the photoresist yields nitride regions 42 of FIG. 5 which will mask gate 36 and junctions 41 and 43 from the subsequent source-drain diffusion so that the sharp contour of the junctions 41 and 43 is preserved. Reactive plasma etching processes are well known, as in U.S. Pat. No. 3,795,557. If it is required to increase the PD breakdown voltage, it may be necessary to increase the radius of curvature 28 of junction 41 by allowing this diffusion to penetrate through the epitaxial layer 40, in which case there is no need for nitride masking layers 42. In what follows, it is assumed that the nitride layers 42 will be used.

Figure 5:
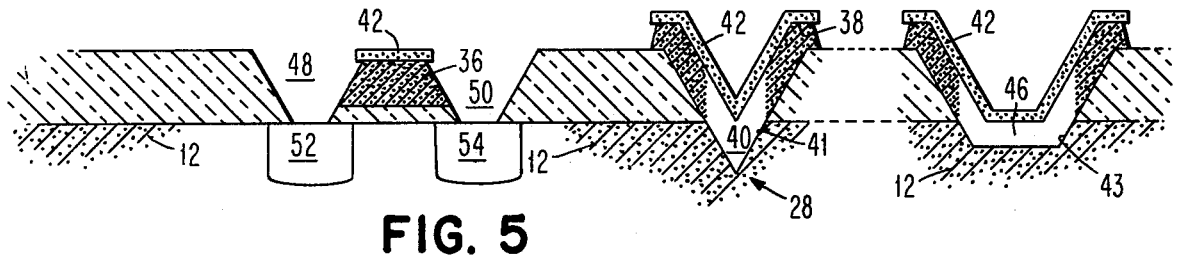
FIG. 5 illustrates a cross-sectional view of the protective device invention after source and drain regions 52 and 54 have been formed.

(8) Dip etch in a solution of $NOH_3$ and HF to etch the unprotected polysilicon layer 34. The process continues with a dip etch in HF to remove the thin oxide 18 covering source and drain regions 48 and 50 as illustrated in FIG. 5.

(9) Diffuse phosphorous to form the source and drain regions 52 and 54. This drive-in cycle will also diffuse the epilayer 38 and 44 dopant so that the junction 41 near the tip 28 of the V-groove will be less acute. As a result, the breakdown voltage increases. The same applies to the flat bottom junction 43 except that its final breakdown voltage will be higher since its initial angle is less acute.

Figure 6:
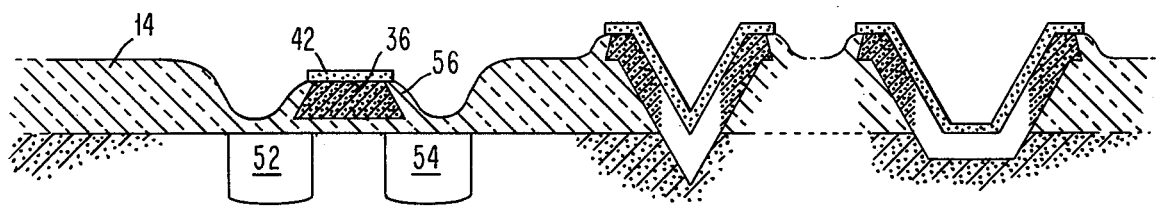
FIG. 6 illustrates a cross-sectional view of the protective device invention after oxide layer 56 is grown over exposed surfaces of polysilicon.

(10) As a first alternative, dip etch in phosphoric acid to remove nitride layers 42 and then proceed by growing 1000Å of thermal oxide on the exposed poly and monosilicon regions and depositing a 3000Å oxide layer by CVD. As a second alternative, nitride layers 42 can be used as oxidation masks while 1000Å of thermal oxide 56 are grown on the exposed polysilicon as is illustrated in FIG. 6. This alternative is advantageous because it provides self-aligned contacts to the polysilicon gate 36.

Mask #4

Figure 7:
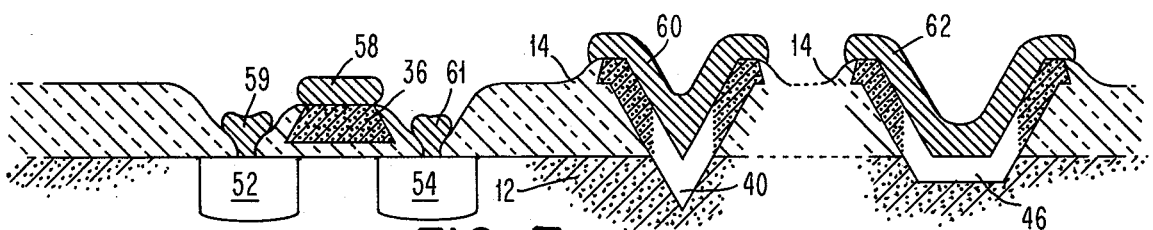
FIG. 7 illustrates a cross-sectional view of the protective device invention after metallized contacts are formed to the device.

(11) Contact openings 59 and 61 to source 52 and drain 54 are defined using mask #4. Contacts 58, 60 and 62 to the gate 36 and PD's 40 and 46 in FIG. 7, are opened by selectively etching nitride layers 42 over these regions. If epi-layers 40 and 46 are not thick enough to keep aluminum from migrating and shorting to the substrate 12, it is preferably to use the first approach given in step #10 and open contact holes to the PD's and gates on top of the field oxide 14, which prevents aluminumsubstrate shorts.

Mask #5

(12) After the deposition of aluminum, use mask #5 to define the interconnection pattern. Anneal the aluminum in forming gas. Finally, encapsulate the structure in quartz.

Figure 8:
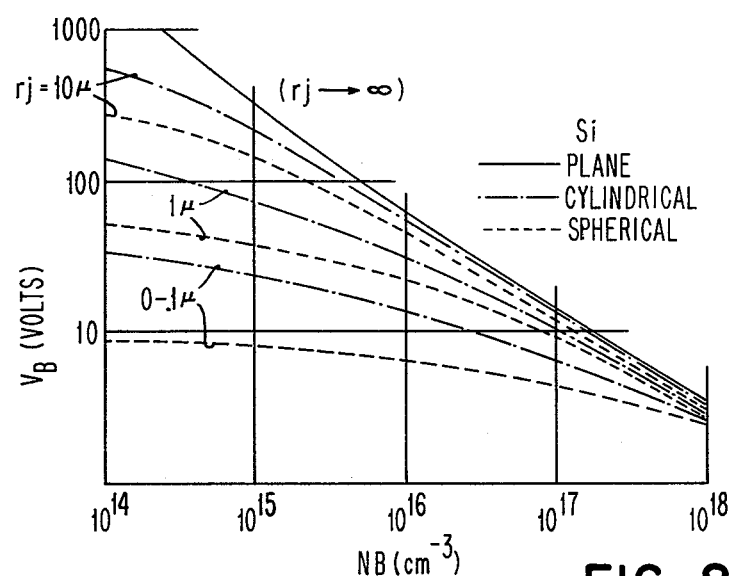
FIG. 8 illustrates the relationship of breakdown voltage, $V_B$, vs. substrate impurity concentration, $N_B$, for different values of junction radius, $r_j$, for abrupt junctions in Si.

In summary, an additional masking step has been incorporated into the conventional polysilicon IGFET process to produce junctions whose radius of curvature can be made smaller than that of conventional diffused junctions of the same depth. For the V-groove shape 41, the geometry can be approximated by a spherical junction while a conventional diffused junction can be approximated by a cylindrical shape. Analytical results for spherical and cylindrical junctions are given in FIG. 8 from the reference cited above by Sze, et al., where it is seen that for a background doping of $10^{15}/cm^3$ and a junction depth of 0.1 micron, the breakdown voltages for these geometries are 8 Volts and 20 Volts, respectively. However, it is difficult to reproducibly make junction depths of 0.1 micron using diffusion in a manufacturing environment. For the proposed technique, the radius of curvature is independent of depth since the V-shaped groove is produced by the self-stopping action of the anisotropic etch. Furthermore, the technique is flexible since the breakdown voltage can be increased by diffusing the impurities of the epitaxial layer during the source-drain drive-in cycle or by using the flat bottom shape. In conclusion, the main features of the method to fabricate p-n junctions suitable for low-breakdown voltage are:

1. Protective diodes with breakdown voltages lower than those of diffused junctions.

2. Reproducibility of the junction breakdown voltage is not a problem since the geometry is controlled by a self-stopping etch.

3. The breakdown voltage is adjustable since it can be raised during the source-drain drive-in cycle.

4. The method is fully compatible with existing silicon gate technology.

5. The additional mask does not require critical alignment.

While the invention has been particulary shown and described with reference to the preferred embodiments thereof, it will be understood by those skilled in the art that the foregoing and other changes in form and details may be made therein without departing from the spirit and scope of the invention.

We claim:

1. A process for simultaneously making a low voltage breakdown p-n junction protective device and a polycrystalline silicon gate FET device in a silicon semiconductor substrate of a first conductivity type, comprising the steps of:

forming a window in a field oxide layer on the surface of said substrate where said FET device is to be located and growing a thermal oxide layer on the surface of the portion of the silicon substrate exposed through said window;

etching a V-shaped groove in the silicon semiconductor substrate with an anisotropic etchant, at a location spaced from said window where said protective device is to be formed;

depositing a layer of epitaxial silicon semiconductor material of a second conductivity type in said V-shaped groove and a layer of polycrystalline silicon over said thermal oxide layer in said window;

etching source and drain openings through said polycrystalline silicon layer and thermal oxide layer in said window forming a polycrystalline gate electrode on a thermal oxide gate insulator;

diffusing source and drain regions of a second conductivity type through said source and drain openings;

forming an electrical contact with said epitaxial silicon layer in said V-shaped groove;

whereby an abrupt p-n junction protective device is formed having a small radius of curvature at the apex of the V-shaped groove with a corresponding low breakdown voltage, simultaneously with the formation of a polycrystalline gate FET device.

2. The process of claim 1, wherein said semiconductor substrate is oriented with its (100) face exposed.

3. The process of claim 2, wherein said etchant anisotropically etches the (100) plane to form said V-shaped groove.

4. The process of claim 3, wherein said etchant is a member of the group consisting of hydrazine-water, ethylenediamine and potassium hydroxide.

5. The process of claim 1, which further comprises the step of:

diffusing the dopant of said second conductivity type in said V-shaped groove to increase said radius of curvature;

whereby said breakdown voltage is increased.

* * * * *